United States Patent
Golke et al.

(10) Patent No.: US 8,217,458 B2
(45) Date of Patent: Jul. 10, 2012

(54) NON-ALIGNED ANTENNA EFFECT PROTECTION CIRCUIT WITH SINGLE EVENT TRANSIENT HARDNESS

(75) Inventors: Keith Golke, Minneapolis, MN (US); Jeff Graebel, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 271 days.

(21) Appl. No.: 12/636,314

(22) Filed: Dec. 11, 2009

(65) Prior Publication Data

US 2011/0141636 A1    Jun. 16, 2011

(51) Int. Cl.
  *H01L 23/62* (2006.01)
  *H01L 29/72* (2006.01)
  *H01L 21/82* (2006.01)
(52) U.S. Cl. .................. 257/355; 257/173; 438/129
(58) Field of Classification Search .................. 257/355, 257/173; 438/129
  See application file for complete search history.

(56) References Cited

U.S. PATENT DOCUMENTS

| | | | |
|---|---|---|---|
| 5,585,949 A | 12/1996 | Yamazaki et al. | |
| 6,275,089 B1 * | 8/2001 | Song et al. | 327/314 |
| 6,426,665 B2 * | 7/2002 | Morishita | 327/310 |
| 6,521,951 B2 * | 2/2003 | Sato et al. | 257/355 |
| 6,933,573 B2 * | 8/2005 | Ker et al. | 257/355 |
| 7,002,216 B2 * | 2/2006 | Huang | 257/355 |
| 7,023,235 B2 | 4/2006 | Hoff | |
| 7,064,574 B1 | 6/2006 | Voogel et al. | |
| 7,111,215 B1 | 9/2006 | Keller et al. | |
| 7,142,004 B2 | 11/2006 | Carlson | |
| 7,327,541 B1 | 2/2008 | Wang et al. | |
| 7,386,826 B1 | 6/2008 | Keller et al. | |
| 7,405,445 B2 * | 7/2008 | Huang et al. | 257/355 |
| 7,411,767 B2 * | 8/2008 | Huang et al. | 361/56 |
| 7,504,851 B2 | 3/2009 | Manohar et al. | |
| 7,505,238 B2 | 3/2009 | Woo et al. | |
| 7,859,807 B2 * | 12/2010 | Wang et al. | 361/56 |
| 7,944,659 B2 * | 5/2011 | Marholev | 361/56 |
| 2002/0109191 A1 | 8/2002 | Sato et al. | |
| 2006/0119379 A1 * | 6/2006 | Carlson | 326/14 |
| 2007/0157349 A1 | 7/2007 | Zhu et al. | |
| 2007/0162880 A1 | 7/2007 | Carlson et al. | |
| 2007/0170510 A1 | 7/2007 | Liao | |
| 2009/0184733 A1 | 7/2009 | Lilja | |

* cited by examiner

*Primary Examiner* — Luan C Thai
(74) *Attorney, Agent, or Firm* — Shumaker & Sieffert, P.A.

(57) ABSTRACT

The disclosure describes an antenna protection circuit for use in circuits where Single Event Transients from energetic particles is a concern. The antenna protection circuit may include at least three diodes, connected electrically in series and arranged such that at most all but one of the at least three diodes produce a transient current pulse from an energetic particle. During the transient current pulse event, the remaining diode remains reverse biased thereby sufficiently blocking the transient current pulse and an SET does not occur on the signal node. The antenna protection circuit may be constructed so that no unshorted parasitic p-n junction structure is associated with any of the diodes in the circuit, which would otherwise have to be explicitly included in the at least three diodes.

20 Claims, 7 Drawing Sheets

US 8,217,458 B2

NON-ALIGNED ANTENNA EFFECT PROTECTION CIRCUIT WITH SINGLE EVENT TRANSIENT HARDNESS

TECHNICAL FIELD

The disclosure relates generally to integrated circuit fabrication with semiconductor devices and, more particularly, to antenna protection circuits.

BACKGROUND

During processing of integrated circuits on a semiconductor wafer, a charge may collect on exposed metal interconnect surfaces, creating a so-called "antenna current." This phenomenon, known as the antenna effect, may occur at each metal layer processed during circuit fabrication. Thus, there can be metal antennas that connect to only MOSFET and/or capacitor thin gate oxide, only p-n junctions, or both. If too much charge accumulates on the metal interconnect, the accumulated charge may damage an aspect, e.g., the gate oxide or p-n junction, of the device fabricated on the wafer. Thus, these signal routing metal interconnect lines need a means to discharge during processing to avoid device damage. One method for discharging the accumulated charge is by connecting a diode between a potentially damage-causing metal line and the other node of the aspect of concern in the device. For example, during the first metal layer processing, a large first metal line of a signal node connected only to a MOSFET gate node will generate a large charge across the gate oxide unless a diode is connected between the gate node and the ground node in such a manner that there is a path through conducting features that exist during first metal processing and/or p-n junctions from the ground node of the diode to the MOSFET body node. A diode that is used to discharge a metal line during wafer fabrication may be referred to as an "antenna diode."

Antenna current is generally small compared to both forward and reverse biased p-n junction leakage current during processing. Thus, p-n junctions can provide an effective path for current to flow in both forward and reverse bias directions during wafer fabrication. p-n junctions are fairly robust to this passing charge but there is a limit. If the MOSFET drain/body p-n junction area is insufficient to handle the antenna current, then an antenna diode may be placed near and in parallel with the MOSFET to increase the effective p-n junction area. Gate oxide will also pass charge but with a very large effective impedance. Thus, significant voltages can develop across the gate oxide that, if high enough, can damage the gate oxide.

Additionally, gate oxide can only tolerate a small amount of passing charge per unit area before long-term reliability is significantly compromised. To prevent gate oxide damage and maintain long term reliability, limits may be defined on the ratio of exposed metal interconnect line's surface area and/or perimeter to the gate oxide area so as not to exceed a gate oxide passing current or charge density limit. When the ratio limit is exceeded, an antenna diode may be placed near the gate of the transistor, e.g., between the gate node and the body node which is generally connected to the voltage supply line (VSS or VDD) node to discharge (i.e., bleed-off, shunt) the charge from the gate node to the body node through the antenna diode p-n junction rather than through the gate oxide.

An antenna diode may be placed and connected to a circuit's signal node such that it is reverse biased during normal circuit operation and thus does not interfere with normal circuit operation. During normal circuit operation, however, energetic particles such as alpha, nuclear weapon generated, naturally occurring above earth's atmosphere in space or generated from an incoming particle interacting with the surrounding material (these generated particles are known as secondary particles) can pass near and/or through the p-n junction of the antenna diode. The Linear Energy Transfer (LET) defines the amount of energy the particle transfers to the surrounding material which in turn defines the number of electron-hole pairs (i.e., charge) produced along the particle's path in the silicon. LET is a function of particle energy and mass. When the particle forms a line of charge in the silicon that is collected by the p-n junction, the antenna diode will produce a current that flows across the p-n junction from the cathode to the anode with a magnitude that is a function of the particle's LET (the higher the LET, the higher the current magnitude) that lasts until the charge produced by the particle is removed or recombines. The net result is the generation of a transient current pulse through the diode. The consequence of this transient current pulse may be a transient false voltage transition (i.e., a single event transient (SET)) on the signal node, if the transient current pulse overpowers the ability of a driver to hold a valid voltage on the signal node and the stored charge of the signal node capacitance.

The SET can generally only disrupt circuit operation if the transient false voltage transition propagates beyond the initially affected signal node. To do this, the transient false voltage transition must change the initial signal node voltage past the reaction voltage level of the downstream circuitry (e.g., the input voltage level where logic gates distinguish between an input high versus low state is known as the input state switching voltage (Vswitch), typically around VDD/2 or the input to an amplifier in which case the voltage change for reaction could be very small) and stay past this reaction voltage level for a period of time sufficient for the downstream circuitry to respond. If the SET produces a transient false voltage transition of sufficient magnitude and duration such that circuitry connected to this node responds, the SET can propagate through the circuit and potentially disrupt the intended operation, ultimately resulting in the disturbance of a circuit containing stored information, such as a memory, latch or register. The unintended change in the stored information will result in an output that could disrupt the proper operation of a system that includes the circuit.

In circuits that have been SET-hardened (designed to produce fewer, less severe, or no SETs and thus SET-immune), or in circuits that do not need SET hardening (the unhardened circuit is sufficiently hard), but SET is a concern, an SET antenna diode that has equivalent or better SET hardness is needed. Otherwise, the addition of the antenna diode can compromise the SET hardening designed into the circuit or in the case of an unhardened circuit can adversely increase the probability of an SET occurring. In most energetic particle environments, such as space, there is a distribution of particle LETs, where the higher the LET, the fewer the particles with that LET. The number of these particles with a particular LET can be statistically averaged in terms of the number of particles impinging a surface in a given time. Many circuits will only produce an SET with LETs greater than a certain limit. Thus, a circuit that is not SET-immune could still have a high enough LET tolerance such that the number of SETs within a given time is small enough to allow acceptable circuit operation.

The MOSFET's drain to body p-n junction will produce a transient current pulse from an energetic particle passing through it. A MOSFET output driver may be able to compensate the transient current pulse and maintain the desired voltage on the signal node for a high enough particle LET that the SET probability of occurrence is acceptable. In this case placing an SET-producing antenna diode near the MOSFET output driver is not likely to significantly increase the SET probability because it will take the same particle LET passing through the antenna diode to generate an SET. However, MOSFET output drivers can drive large capacitance loads which frequently have long metal lines from the driver to the gates and thus significant metal resistance. If an SET-producing antenna diode is placed near the gate, the metal resistance back to the output driver may compromise the ability of the output driver to compensate for the charge collected from a particle LET in the antenna diode. As a result, an SET that disturbs circuit operation may be produced at a much lower LET than if the particle had passed through the output driver or an antenna diode placed near the output driver resulting in an increase in SET probability that may be unacceptable. Hence, an antenna diode with sufficient SET hardness is needed.

SUMMARY

In general, the disclosure is directed to an antenna protection circuit connected between a signal node and voltage supply (e.g., VDD or VSS) comprising at least three p-n junction devices having a non-aligned arrangement that promotes SET hardness. The disclosure describes an antenna protection circuit for use in circuits where there is an SET concern. The antenna protection circuit may include at least three p-n junction devices, connected electrically in series and arranged such that at most all but one of the at least three p-n junction devices produce a transient current pulse from an energetic particle. During the transient current pulse event, the remaining p-n junction device sufficiently blocks the transient current pulse and an SET does not occur on the signal node. The antenna protection circuit may be constructed so that no parasitic p-n junction structure (e.g., diode or BJT) is associated with any of the intended p-n junction devices in the circuit.

In one aspect, the antenna protection circuit comprises at least three p-n junction devices connected in series, wherein a first of the at least three p-n junction devices is connected to a signal line, wherein a last of the at least three p-n junctions is connected to a voltage supply line, and wherein the at least three p-n junction devices are arranged such that a straight line cannot pass through all of the at least three p-n junction devices.

In one aspect, the disclosure is directed to a method for protecting a metal line from charge accumulation during fabrication without introducing a single event transient weakness to a circuit connected to the metal line, the method comprising connecting at least three p-n junction devices in series, connecting a first of the at least three p-n junction devices to a signal line, connecting a last of the at least three p-n junction devices to a voltage supply line (VSS or VDD), and arranging the at least three p-n junction devices such that a straight line cannot pass through all of the at least three p-n junction devices, wherein the anode and cathode arrangement is such that at most all but one of the at least three diodes produce a temporary current pulse from an energetic particle and the remaining diode will sufficiently block the temporary current pulse to prevent the occurrence of a voltage transient that can propagate in the downstream circuitry.

The details of one or more examples of the disclosure are set forth in the accompanying drawings and the description below. Other features, objects, and advantages of the disclosure will be apparent from the description and drawings, and from the claims.

DETAILED DESCRIPTION

In general, the disclosure is directed to an integrated circuit (IC) where SET is a concern and may include elements to promote SET hardness. Some semiconductor devices are designed to operate in conditions that expose the devices to energetic particles such as, for example, in space applications, during flights, or during warfare. An antenna diode may be placed on a signal line that is driven by a circuit where SET is a concern. There may be a significant interconnect resistance between the antenna diode and the drain of the driving transistor. An energetic particle strike on a reverse biased p-n junction of the antenna diode may cause a current to flow in the diode, potentially causing a significant voltage glitch at the end of the line. Thus, the insertion of the antenna diode for antenna charge bleed-off during fabrication may introduce an SET weakness to a circuit that has been otherwise hardened against SET.

Generally, energetic particles travel in a straight line through silicon containing IC devices. Referenced to a fixed point, the region in three-dimensional space from which particles can come and pass through the reference point is known as the solid angle. The solid angle has a maximum value of $4\pi$ steradians, i.e., from all directions. Consequently, a reduction in the solid angle reduces the number of particles and, in turn, reduces the number of generated SETs. It should be understood that while the following discusses techniques of the disclosure in terms of diodes and other specific p-n junction devices, that other p-n junction devices may be utilized to practice the techniques of the disclosure.

Figure 1:
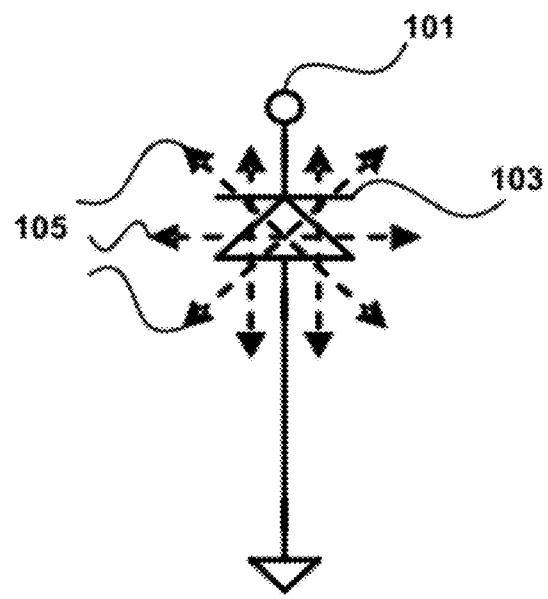
FIG. 1 is a circuit diagram illustrating a prior art antenna diode circuit comprising a single diode.

FIG. 1 is a circuit diagram illustrating a prior art antenna diode circuit comprising a single antenna diode 103. A cathode of diode 103 may be connected to a node 101 in a circuit, such as a signal line. An anode of diode 103 may be coupled to a ground voltage supply line in such a manner that there is a path through conducting material and/or p-n junction(s) from the antenna diode to the other node of the aspect of concern in the device connected to the signal line. Diode 103 may form part of a larger circuit, and may be provided to discharge antenna current from node 101. Lines 105 represent the paths an energetic particle may travel through the diode 103. In limited situation, there may be a small but finite probability that a particle's path can be altered from a straight if it interacts with the nuclei of the atoms in the material through which it is passing. However, to first order, the particle travels in a straight line for distances commonly associated with devices in an integrated circuit. Additionally, a deviation from a straight line path may be accounted for by defining a radius about the straight line to create a cylinder that encloses the actual particle path and then replace the straight line concept with a cylinder concept. As shown in FIG. 1, an energetic particle can come from any direction and take any one of an infinite number of paths and still pass through the diode 103, thus producing an SET and potentially disrupting operation of a circuit coupled to the diode. Therefore, the solid angle associated with this arrangement is the maximum value.

Figure 2:
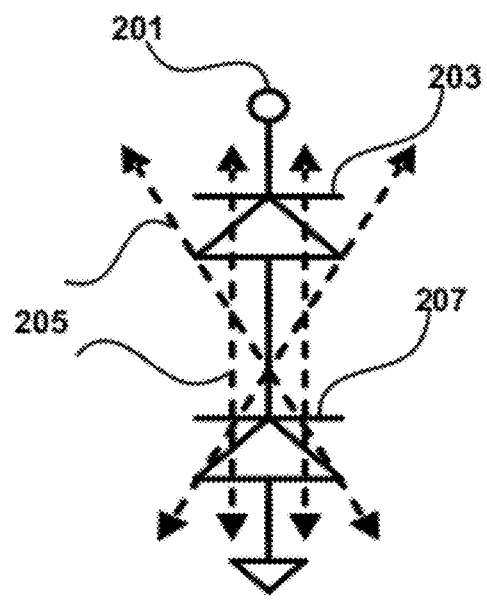
FIG. 2 is a circuit diagram illustrating another prior art antenna diode circuit comprising two diodes.

FIG. 2 is a circuit diagram illustrating another prior art antenna diode circuit comprising two diodes. The antenna diode of FIG. 2 is generally described in U.S. patent application Ser. No. 11/330,882, filed Jan. 12, 2006, titled "Single Event Transient Immune Antenna Diode Circuit," and published as U.S. Patent Application Publication No. 2007/0162880, published Jul. 12, 2007, the entire content of which is incorporated herein by reference The two diode antenna diode circuit protects against charge accumulation during circuit fabrication and provides some SET hardening, by decreasing the numbers of paths of an energetic particle that would cross both diodes, and produce an SET. Therefore, in this arrangement, the particles can only come from certain directions to pass through both diodes and produce a transient current pulse that generates an SET. An energetic particle that passes through only one of the diodes and produces a transient current pulse, does not generate an SET if the transient current pulse is sufficiently blocked by the other diode. Therefore, the solid angle associated with the arrangement of FIG. 2 is smaller than that of the arrangement of FIG. 1, and therefore the probability of generating an SET is much smaller. Additionally, as the distance between the diodes increases, the solid angle decreases, and approaches zero as the distance between the diodes approaches infinity. However, the small areas in which integrated circuits are built may not allow accommodating very large distances between the diodes. Therefore, there may be some paths 205 that an energetic particle may travel by which it may cross both diodes 203 and 207. While the probability of SET in the example of FIG. 2 is smaller than that of FIG. 1, an SET may be produced and circuit operation may still be disrupted at an unacceptable probability.

Figure 3:
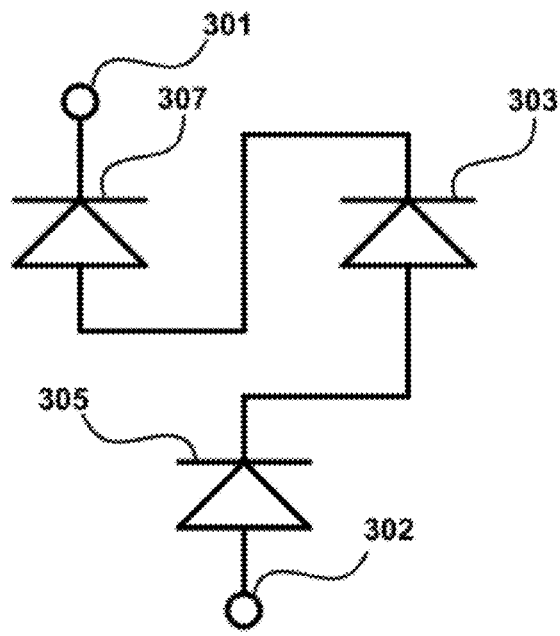
FIG. 3 is a circuit diagram illustrating a three-diode antenna protection circuit in accordance with an example of this disclosure.

FIG. 3 is a circuit diagram illustrating a three-diode antenna protection circuit in accordance with an example of this disclosure. The circuit diagram of FIG. 3 is an antenna protection circuit that may be connected to a signal line that is driven by a circuit where SET is a concern. In one example, the cathode of the first diode 307 may be connected to a node 301 associated with the signal line. The anode of the first diode 307 may be connected to the cathode of a second diode 303. The anode of the second diode 303 may be connected to the cathode of a third diode 305, and the anode of the third diode 305 may be connected to a node 302 and associated with the ground voltage supply line in such a manner that there may be a path through conducting material and/or p-n junction(s) from the antenna diode to the other node of the aspect of concern in the device connected to the signal line. The antenna protection circuit of FIG. 3 may be connected between the signal line node 301 and the ground voltage supply line node 302 and may protect the signal line from antenna current during fabrication without introducing an SET vulnerability during operation of a circuit connected to the signal line. As depicted in FIG. 3, the three diodes 303, 305, and 307 may be electrically connected in series between the signal line node 301 (302) and a voltage supply line VSS (VDD) node 302 (301), and physically arranged relative to one another such that no straight line can pass through all three diodes. Therefore, during normal circuit operation, if any two diodes produce a transient current pulse due to an energetic particle that passes through the two diodes in a straight line, the third diode remains reverse biased thereby sufficiently blocking the transient current pulse, and as a result an SET does not occur. As a result, an SET will not be produced on the signal line due to any particle strike on the antenna protection circuit.

In one example of the disclosure, the diodes may be connected utilizing a technology that ensures that no parasitic p-n junction structures such as, for example, diodes or BJT structures are associated with any of the three diodes. For example, silicon on insulator (SOI) technology, e.g., silicon on insulating oxide or silicon on sapphire (SOS), may be utilized to connect the diodes and position them in the desired arrangement.

In this example, there is no direction from which an energetic particle can come from and pass through all three diodes. Instead, the particle may pass through at most two of the three diodes 303, 305, 307. The solid angle associated with this arrangement is zero, resulting in a true SET-hardened circuit. In some examples, the three diodes may reside on substantially the same silicon plane, or be spatially arranged so that some of the diodes are on different silicon planes.

Figure 4:
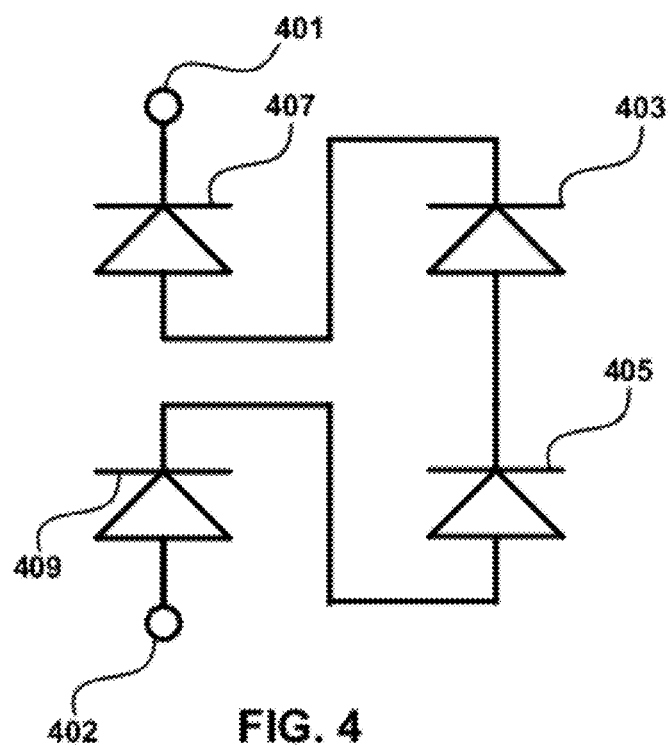
FIG. 4 is a circuit diagram illustrating a four-diode antenna protection circuit in accordance with an example of this disclosure.

FIG. 4 is a circuit diagram illustrating a four-diode antenna protection circuit in accordance with an example of this disclosure. The circuit diagram of FIG. 4 is an antenna protection circuit that may be connected to a signal line that is driven by a circuit where SET is a concern. In one example, the cathode of the first diode 407 may be connected to a node 401 associated with the signal line. The anode of the first diode 407 may be connected to the cathode of a second diode 403. The anode of the second diode 403 may be connected to the cathode of a third diode 405. The anode of the third diode 405 may be connected to the cathode of the fourth diode 409, and the anode of the fourth diode 409 may be connected to a node 402 and associated with the ground voltage supply line in such a manner that there may be a path through conducting material and/or p-n junction(s) from the antenna diode to the other node of the aspect of concern in the device connected to the signal line. The antenna protection circuit of FIG. 4 may be connected between the signal line node 401 and the ground voltage supply line node 402 and may protect the signal line from antenna current during fabrication without introducing an SET vulnerability during operation of a circuit connected to the signal line. As depicted in FIG. 4, the four diodes 403, 405, 407, and 409 may be electrically connected in series between the signal line node 401 (402) and a voltage supply line VSS (VDD) node 402 (401), and physically arranged relative to one another such that no straight line can pass through all four diodes. Therefore, during normal circuit operation, if any three diodes produce a transient current pulse due to an energetic particle that passes through the three diodes in a straight line, the forth diode remains reverse biased thereby sufficiently blocking the transient current pulse, and as a result an SET does not occur. As a result, an SET will not be produced on the signal line due to any particle strike on the antenna protection circuit.

In one example of the disclosure, the diodes may be connected utilizing a technology that ensures that no parasitic p-n junction structures such as, for example, diodes or BJT structures are associated with any of the four diodes. For example, silicon on insulator (SOI) technology, e.g., silicon on insulating oxide or silicon on sapphire (SOS), may be utilized to connect the diodes and position them in the desired arrangement.

In this example, there is no direction from which an energetic particle can come from and pass through all four diodes. Instead, the particle may pass through at most three of the four diodes 403, 405, 407, 409. The solid angle associated with this arrangement is zero, resulting in a true SET-hardened circuit. In some examples, the diodes may reside on substantially the same silicon plane, or be spatially arranged so that some of the diodes are on different silicon planes. Additionally, in a four-diode arrangement smaller spacing may be needed between the diodes to ensure that a straight line does not go through all diodes, and therefore, a smaller space, as defined by the outer extent of the diode constructs, may be needed on the circuit to achieve the SET hardness.

Figure 5:
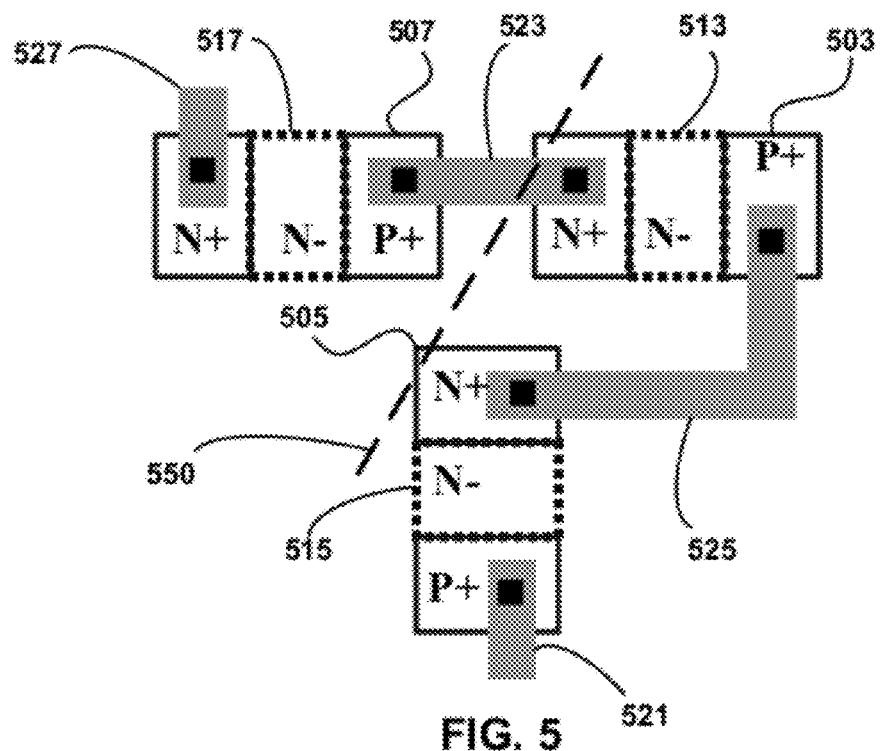
FIG. 5 is a layout diagram illustrating an example of a three-diode arrangement using p-n junction diodes in a silicon on insulator (SOI) technology.

FIG. 5 is a layout diagram illustrating an example of a three diode arrangement using SOI technology. Some SOI technologies can only form lightly doped silicon regions under the MOSFET gate oxide (i.e., the MOSFET body region) which ends up under a poly feature. These are known as floating body SOI. Other SOI technologies have additional process capabilities that allow forming lightly doped silicon regions under and outside gate oxide/poly regions. The lightly doped silicon region outside the gate oxide/poly region is termed the silicon body-tie region since it can directly tie (i.e., connect) into the MOSFET body region under the gate oxide. This is known as body-tied SOI. This example may use SOI technology with silicon body-tie capability. Typically, SOI technologies have a thin silicon layer in which the devices are formed with an insulating region under the thin silicon layer. The three diodes 503, 505, and 507 may be connected between the signal node and VSS, the signal node and VDD, or both. Each of the diodes 503, 505, and 507 may comprise a heavily doped p-type (P+) and a heavily doped n-type (N+) region, with lightly doped n-type (N−) body-tie regions, 513, 515, and 517, respectively, which electrically connect directly to the N+ region since that is of the same doping type. The body-ties 713, 715, 717, and 719 may be either N− or P− body-tie.

The diodes may be connected to one another and to the signal node and voltage supply lines (VSS or VDD) using a conductor 521, 523, 525, and 527, such as a metal, connected to the diodes using contacts. When connected to one another, the p-type region of one diode may be connected to the n-type region of the next diode, as illustrated by connections 523 and 525, connecting diodes 507 and 503 and diodes 503 and 505, respectively. The connections 527 and 521 may be connected to a signal line and a voltage supply line (VSS or VDD).

In this example, the body-ties 513, 515, and 517 may be N− body-ties, which may be preferred since the P+/N− reverse biased junction may have lower leakage than the N+/P− reverse biased junction. The connections between the diodes may be metal connecting the diodes through the contacts as shown in FIG. 5. The diodes and the body-ties may be surrounded by oxide.

In the example of FIG. 5, the three diodes may be arranged such that a straight line may pass through at most two diodes. Therefore, during normal circuit operation, at most only two diodes may produce a transient current pulse by a line of charge from an energetic particle passing through, the other diode remains reverse biased thereby sufficiently blocking the transient current pulse, and as a result an SET will not be produced on the signal node.

Figure 6:
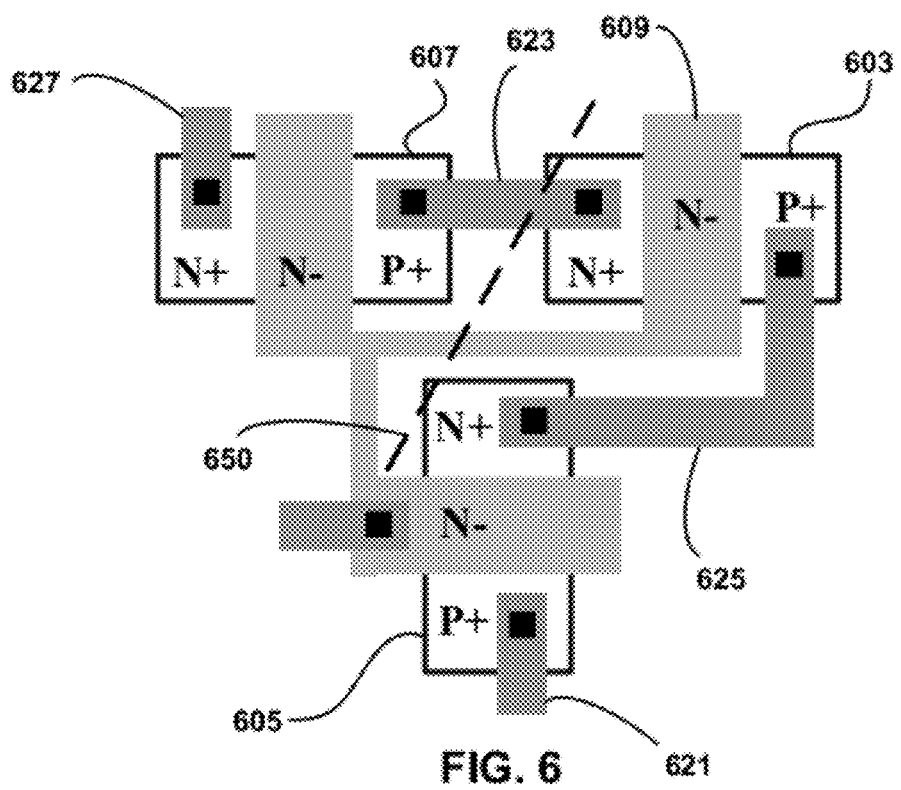
FIG. 6 is a layout diagram illustrating an example of a three diode arrangement using gated p-n junction diodes in a silicon on insulator (SOI) technology.

FIG. 6 is a layout diagram illustrating an example of a three diode arrangement using floating body SOI technology. In this example, the diodes of FIG. 5, for example, may be replaced with MOSFET devices 603, 605, and 607, which are constructed to function as diodes by replacing one of their source/drain doping types with the type that matches the body region doping type. The MOSFETs (also known as gated p-n junction diodes) may be connected between a signal line and a voltage supply line (VSS or VDD). The MOSFETs may be either P-channel, where N− may be in the region under the poly gate and the poly is connected to VDD to keep the gate off, or N-channel, where P− is in the region under the poly gate and the poly is connected to VSS to keep the gate off. In the example of FIG. 6, the poly 609 may be utilized to create the effect of the body-ties 513, 515, and 517 of FIG. 5. The MOSFETs of FIG. 6 may be surrounded by oxide. The MOSFETs may be connected to one another and to the signal node and voltage supply lines (VSS or VDD) using a conductor 621, 623, 625, and 627, such as a metal, connected to the MOSFETs using contacts. When connected to one another, the p-side of one diode may be connected to the n-side of the next diode, as illustrated by connections 623 and 625, connecting MOSFETs 607 and 603 and MOSFETs 603 and 605, respectively. The connections 627 and 621 may be connected to a signal line and a voltage supply line (VSS or VDD).

It should be understood that MOSFETs are only exemplary and may be replaced with other devices and/or configurations to achieve the desired antenna current protection and SET hardness as long as any one of the devices, when the other two produce a transient current pulse from an energetic particle, sufficiently block the transient current pulse and allow normal circuit operation. Examples of other devices and/or configurations may include: MOSFET (floating body or body-tie) with gate connected to source and MOSFET (floating body or body-tie) with gate connected to a voltage supply such that it is always off and BJT with base connected to emitter.

In the example of FIG. 6, the three MOSFETs may be arranged such that a straight line may pass through at most two MOSFETs. Therefore, during normal circuit operation, at most only two MOSFETs may produce a transient current pulse by a line of charge from an energetic particle passing through; the other MOSFET remains reverse biased thereby sufficiently blocking the transient current pulse. As a result, an SET will not be produced on the node.

Figure 7:
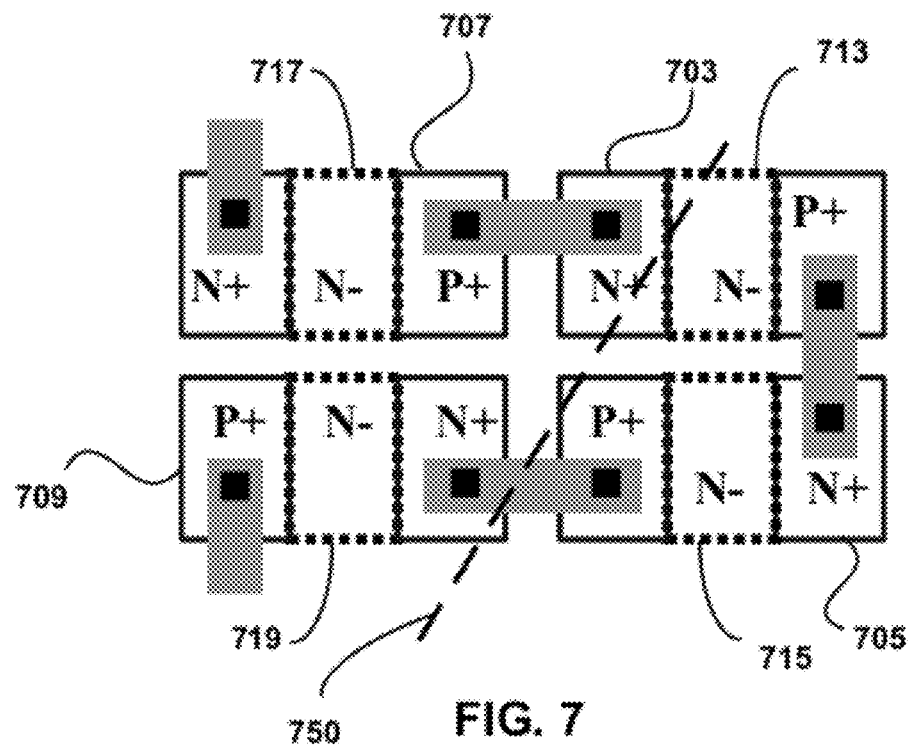
FIG. 7 is a layout diagram illustrating an example of a four diode arrangement using p-n junction diodes in a silicon on insulator (SOI) technology.

FIG. 7 is a layout diagram illustrating an example of a four diode arrangement using SOI technology. In this example, the circuit may be similar to that discussed above with respect to FIG. 5. The example may use SOI technology with silicon body-tie capability. The four diodes 703, 705, 707, and 709 may be connected between the signal node and VSS, the signal node and VDD, or both. Each of the diodes 703, 705, 707, and 709 may comprise a heavily doped p-type (P+) and a heavily doped n-type (N+) region, with lightly doped n-type (N−) body-tie regions, 713, 715, 717, and 719, respectively, which may electrically connect directly to the N+ region since that is of the same doping type. The body-ties 713, 715, 717, and 719 may be either N− or P− body-tie.

The diodes may be connected to one another and to the signal node and voltage supply lines (VSS or VDD) using a conductor, such as a metal, connected to the diodes using contacts. When connected to one another, the p-type region of one diode may be connected to the n-type region of the next diode, as illustrated by the conductor connecting diodes 707 and 703, diodes 703 and 705, and diodes 705 and 709. The conductor may also be used to connect to a signal line and a voltage supply line (VSS or VDD).

In this example, the body-ties 713, 715, 717, and 719 may be N− body-ties, which may be preferred since the P+/N− reverse biased junction may have lower leakage than the N+/P− reverse biased junction. The connections between the diodes may be metal connecting the diodes through the contacts as shown in FIG. 7. The diodes and the body-ties may be surrounded by oxide.

In the example of FIG. 7, the four diodes may be arranged such that a straight line may pass through at most three diodes. Therefore, during normal circuit operation, at most only three diodes may produce a transient current pulse by a line of charge from an energetic particle passing through; the other diode remains reverse biased thereby sufficiently blocking the transient current pulse. As a result, an SET will not be produced on the signal node.

Figure 8:
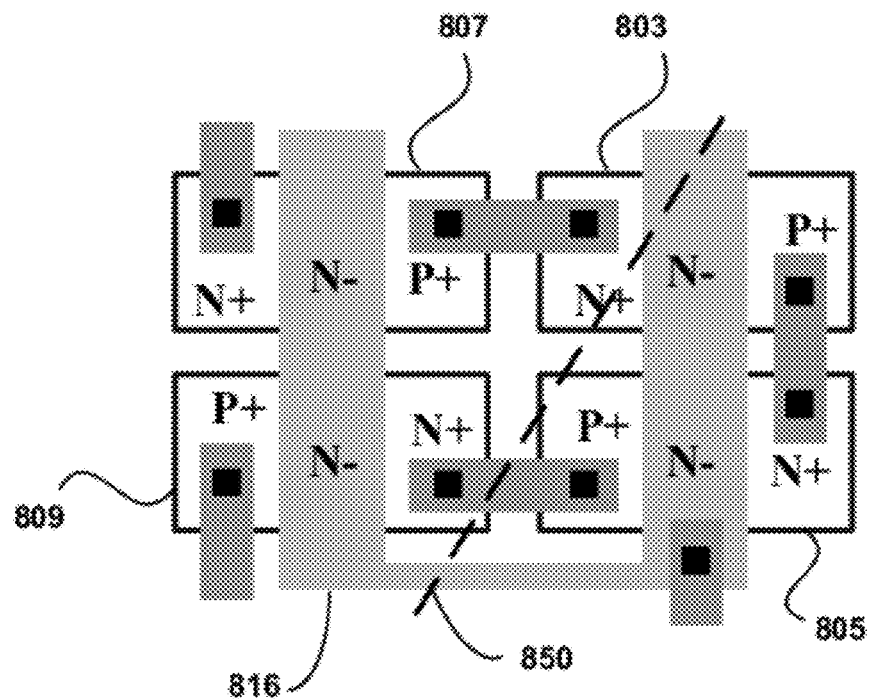
FIG. 8 is a layout diagram illustrating an example of a four diode arrangement using gated p-n junction diodes in a silicon on insulator (SOI) technology.

FIG. 8 is a layout diagram illustrating an example of a four diode arrangement using floating body SOI technology. In this example, the circuit may be similar to that discussed above with respect to FIG. 6. In this example, the diodes of FIG. 7, for example, may be replaced with MOSFET devices 803, 805, 807, and 809, which may be constructed to function as diodes by replacing one of their source/drain doping types with the type that matches the body region doping type. The MOSFETs (also known as gated p-n junction diodes) may be connected between a signal line and a voltage supply line (VSS or VDD). The MOSFETs may be either P-channel, where N− may be in the region under the poly gate and the poly is connected to VDD to keep the gate off, or N-channel, where P− is in the region under the poly gate and the poly is connected to VSS to keep the gate off In the example of FIG. 8, the poly 819 may be utilized to create the effect of the body-ties 713, 715, 717, and 719 of FIG. 7. The MOSFETs of FIG. 8 may be surrounded by oxide. The MOSFETs may be connected to one another and to the signal node and voltage supply lines (VSS or VDD) using a conductor, such as a metal, connected to the MOSFETs using contacts. When connected to one another, the p-side of one diode may be connected to the n-side of the next diode, as illustrated by the conductor connecting MOSFETs 807 and 803, MOSFETs 803 and 805, and MOSFETs 805 and 809. The conductor may also be used to connect to a signal line and a voltage supply line (VSS or VDD).

It should be understood that MOSFETs are only exemplary and may be replaced with other devices and/or configurations to achieve the desired antenna current protection and SET hardness as long as any one of the devices, when the other two produce a transient current pulse from an energetic particle, sufficiently block the transient current pulse and allow normal circuit operation. Examples of other devices and/or configurations may include: MOSFET (floating body or body-tie) with gate connected to source and MOSFET (floating body or body-tie) with gate connected to a voltage supply such that it is always off and BJT with base connected to emitter.

In the example of FIG. 8, the four MOSFETs may be arranged such that a straight line may pass through at most three MOSFETs. Therefore, during normal circuit operation, at most only three MOSFETs may produce a transient current pulse by a line of charge from an energetic particle passing through, the other MOSFET remains reverse biased thereby sufficiently blocking the transient current pulse, and as a result an SET will not be produced on the node.

The location and orientation of the diodes/MOSFETs relative to each other in FIG. 5/7 and FIG. 6/8 may be such that there is no straight line that can pass through all diodes/MOSFETs. The diodes/MOSFETs may be moved and rotated to make other configurations as long as the net result is that there is no straight line that can pass through all diodes/MOSFETs. Lines 550, 650, 750, and 850, in FIGS. 5, 6, 7, and 8, respectively, illustrate the closest point a straight line may get to touching all diodes/MOSFETs, but only touching two out of the three or three out of the four diodes/MOSFETs.

In one example, oxide may surround each of the diodes/MOSFETs. In another example, it may be possible to merge some of the silicon regions to reduce metal interconnect. Most technologies silicide the P+ and N+ regions to reduce their parasitic resistance. The silicide may be capable of bridging a P+/N+ junction and short them together. This is illustrated in FIGS. 9, 10, 11, and 12, which correspond to FIGS. 5, 6, 7, and 8, respectively, discussed above. Merging the P+/N+ field cut regions may create additional p-n junctions, which may not be parasitic because they are shorted out by the silicide.

Figure 9:
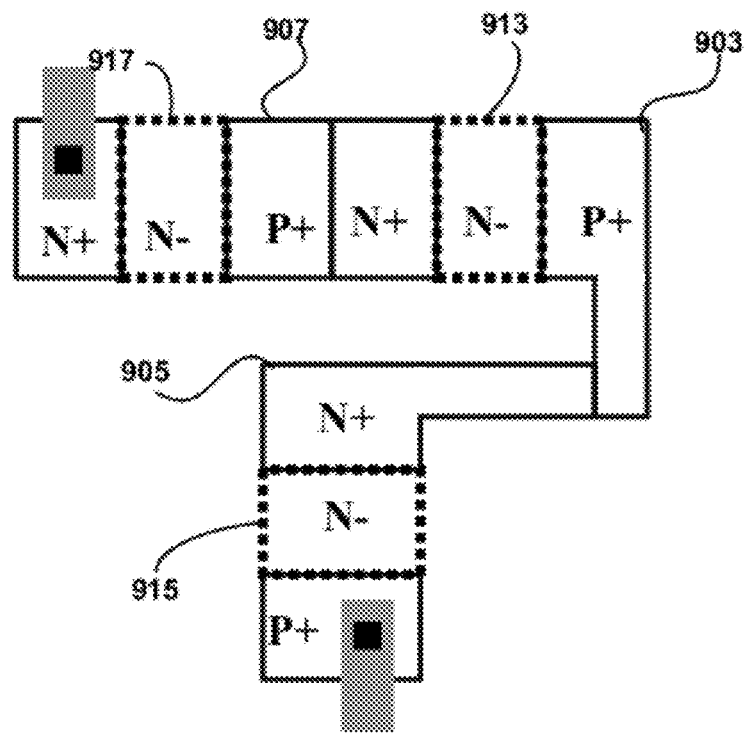
FIG. 9 is a layout diagram illustrating an example of a three diode arrangement using p-n junction diodes in a silicon on insulator (SOI) technology with silicide that can bridge p-n junctions.

FIG. 9 is a layout diagram illustrating an example of a three diode arrangement using body-tied SOI technology with silicide. The three diodes 903, 905, and 907 may be connected between the signal node and VSS, the signal node and VDD, or both. Each of the diodes 903, 905, and 907 may comprise a heavily doped p-type (P+) and a heavily doped n-type (N+) region, with lightly doped n-type (N−) body-tie regions, 913, 915, and 917, respectively, which may electrically connect directly to the N+ region since that is of the same doping type. The body-ties 913, 915, and 917 may be either N− or P− body-tie. The diodes may be connected to one another by silicide. The diodes may also be connected to the signal node and voltage supply lines (VSS or VDD) using a conductor, such as a metal, connected to the diodes using contacts.

In the example of FIG. 9, the three diodes may be arranged such that a straight line may pass through at most two diodes. Therefore, during normal circuit operation, at most only two diodes may produce a transient current pulse by a line of charge from an energetic particle passing through, while the other diode remains reverse biased, and thereby sufficiently blocking the transient current pulse. As a result, an SET will not be produced on the signal node.

Figure 10:
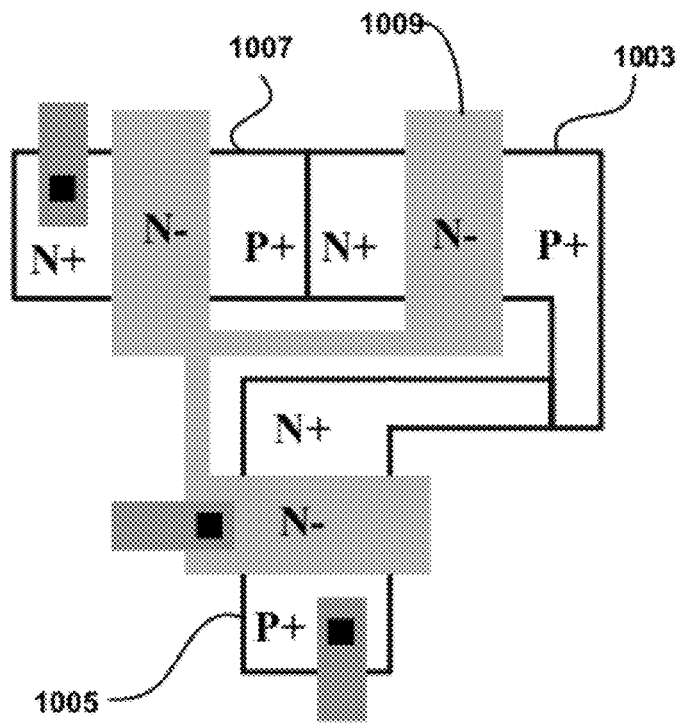
FIG. 10 is a layout diagram illustrating an example of a three diode arrangement using gated p-n junction diodes in a silicon on insulator (SOI) technology with silicide that can bridge p-n junctions.

FIG. 10 is a layout diagram illustrating an example of a three diode arrangement using floating body SOI technology with silicide. Floating body SOI may not have body-tie capability. In this example, the diodes of FIG. 9, for example, may be replaced with MOSFET devices 1003, 1005, and 1007, which may be constructed to function as diodes by replacing one of their source/drain doping types with the type that matches the body region doping type. The MOSFETs may be connected between a signal line and a voltage supply line (VSS or VDD). The MOSFETs may be either P-channel, where N− may be in the region under the poly gate and the poly is connected to VDD to keep the gate off, or N-channel, where P− is in the region under the poly gate and the poly is connected to VSS to keep the gate off In the example of FIG. 10, the poly 1009 may be utilized to create the effect of the body-ties 913, 915, and 917 of FIG. 9. The MOSFETs may be connected to one another by silicide. The MOSFETs may also be connected to the signal node and voltage supply lines (VSS or VDD) using a conductor, such as a metal, connected to the diodes using contacts.

It should be understood that MOSFETs are only exemplary and may be replaced with other devices and/or configurations to achieve the desired antenna current protection and SET hardness as long as any one of the devices, when the other two produce a transient current pulse from an energetic particle, sufficiently block the transient current pulse and allow normal circuit operation. Examples of other devices and/or configurations may include: MOSFET (floating body or body-tie) with gate connected to source and MOSFET (floating body or body-tie) with gate connected to a voltage supply such that it is always off and BJT with base connected to emitter.

In the example of FIG. 10, the three MOSFETs may be arranged such that a straight line may pass through at most two MOSFETs. Therefore, during normal circuit operation, at most only two MOSFETs may produce a transient current pulse by a line of charge from an energetic particle passing through, while the other MOSFET remains reverse biased thereby sufficiently blocking the transient current pulse. As a result, an SET will not be produced on the node.

Figure 11:
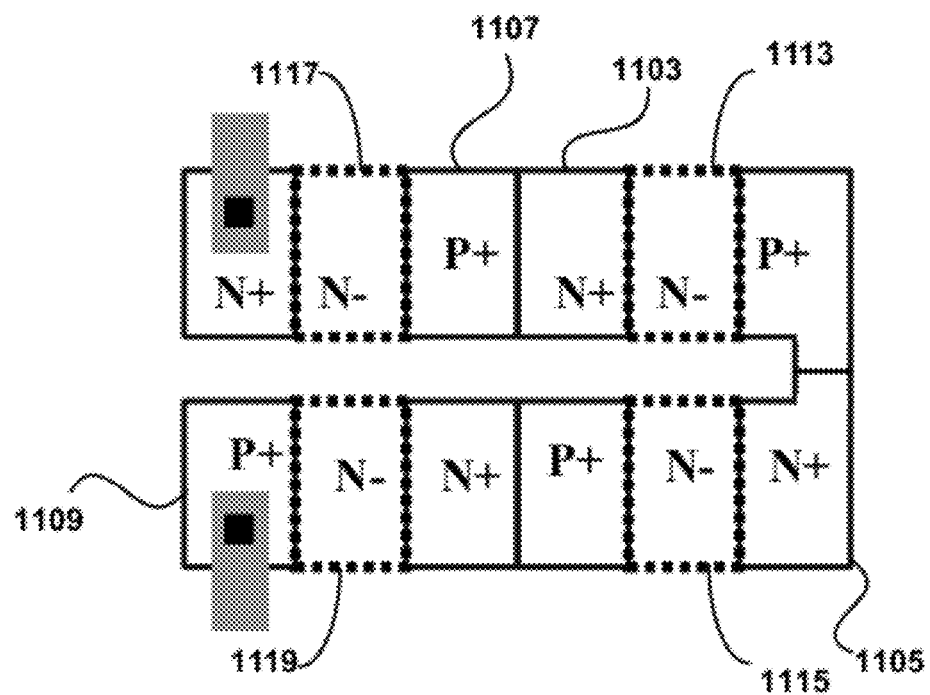
FIG. 11 is a layout diagram illustrating an example of a four diode arrangement using p-n junction diodes in a silicon on insulator (SOI) technology with silicide that can bridge p-n junctions.

FIG. 11 is a layout diagram illustrating an example of a four diode arrangement using SOI technology with silicide. The four diodes 1103, 1105, 1107, and 1109 may be connected between the signal node and VSS, the signal node and VDD, or both. Each of the diodes 1103, 1105, 1107, and 1109 may comprise a heavily doped p-type (P+) and a heavily doped n-type (N+) region, with lightly doped n-type (N−) body-tie regions, 1113, 1115, 1117, and 1119, respectively, which may electrically connect directly to the N+ region since that is of the same doping type. The body-ties 1113, 1115, 1117, and 1119 may be either N− or P− body-tie. The diodes may be connected to one another by silicide. The diodes may also be connected to the signal node and voltage supply lines (VSS or VDD) using a conductor, such as a metal, connected to the diodes using contacts.

In the example of FIG. 11, the four diodes may be arranged such that a straight line may pass through at most three diodes. Therefore, during normal circuit operation, at most only three diodes may produce a transient current pulse by a line of charge from an energetic particle passing through, while the other diode remains reverse biased thereby sufficiently blocking the transient current pulse. As a result, an SET will not be produced on the node.

Figure 12:
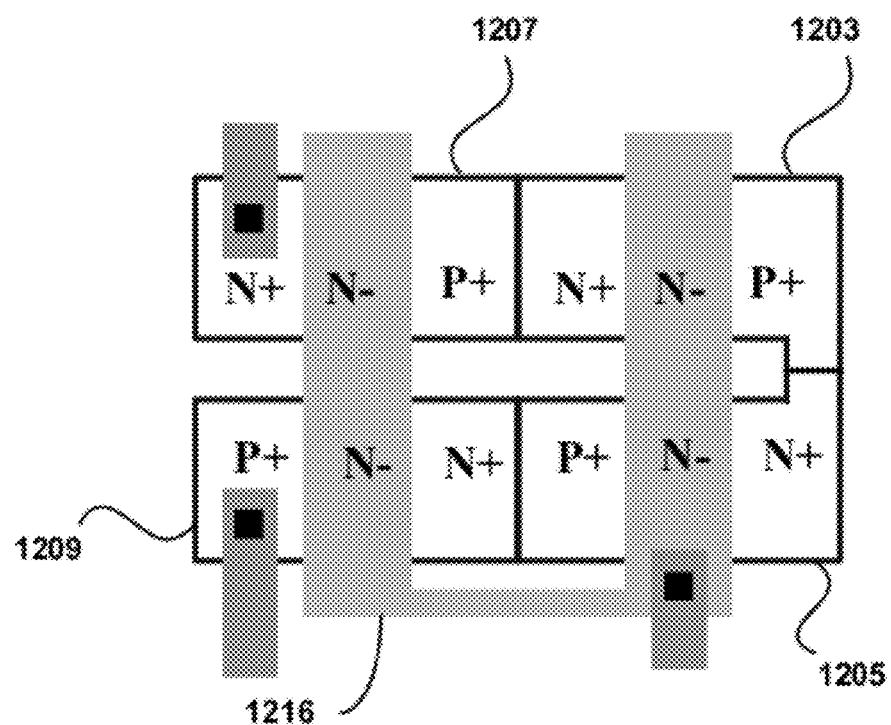
FIG. 12 is a layout diagram illustrating an example of a four diode arrangement using gated p-n junction diodes in a silicon on insulator (SOI) technology with silicide that can bridge p-n junctions.

FIG. 12 is a layout diagram illustrating an example of a four diode arrangement using floating body SOI technology with silicide. Floating body SOI may not have body-tie capability. In this example, the diodes of FIG. 11, for example, may be replaced with MOSFET devices 1203, 1205, 1207, and 1209, which are constructed to function as diodes by replacing one of their source/drain doping types with the type that matches the body region doping type. The MOSFETs (also known as gated p-n junction diodes) may be connected between a signal line and a voltage supply line (VSS or VDD). The MOSFETs may be either P-channel, where N− may be in the region under the poly gate and the poly is connected to VDD to keep the gate off, or N-channel, where P− is in the region under the poly gate and the poly is connected to VSS to keep the gate off. In the example of FIG. 12, the poly 1216 may be utilized to create the effect of the body-ties 1113, 1115, 1117, and 1119 of FIG. 11. The MOSFETs may be connected to one another by silicide. The MOSFETs may also be connected to the signal node and voltage supply lines (VSS or VDD) using a conductor, such as a metal, connected to the diodes using contacts.

It should be understood that MOSFETs are only exemplary and may be replaced with other devices and/or configurations to achieve the desired antenna current protection and SET hardness as long as any one of the devices, when the other two produce a transient current pulse from an energetic particle, sufficiently block the transient current pulse and allow normal circuit operation. Examples of other devices and/or configurations may include: MOSFET (floating body or body-tie) with gate connected to source and MOSFET (floating body or body-tie) with gate connected to a voltage supply such that it is always off and BJT with base connected to emitter.

In the example of FIG. 12, the four MOSFETs may be arranged such that a straight line may pass through at most three MOSFETs. Therefore, during normal circuit operation, at most only three MOSFETs may produce a transient current pulse by a line of charge from an energetic particle passing through, while the other MOSFET remains reverse biased thereby sufficiently blocking the transient current pulse. As a result, an SET will not be produced on the node.

In another example, the diodes of the antenna protection circuit may be MOSFETs connected in a diode configuration. This may be useful in a sea-of-gates gate array ASIC (Application Specific Integrated Circuit). A typical basecell in a sea-of-gates gate array ASIC contains 2 P-channel and 2 N-channel MOSFET devices and no diode devices. In a sea-of-gates arrangement basecell, the body connections of MOSFETs may be a common node or may be separate nodes. In some examples, where area may be limited, MOSFETs may be used in place of diodes as MOSFETs generally occupy less area than diodes.

Figure 13:
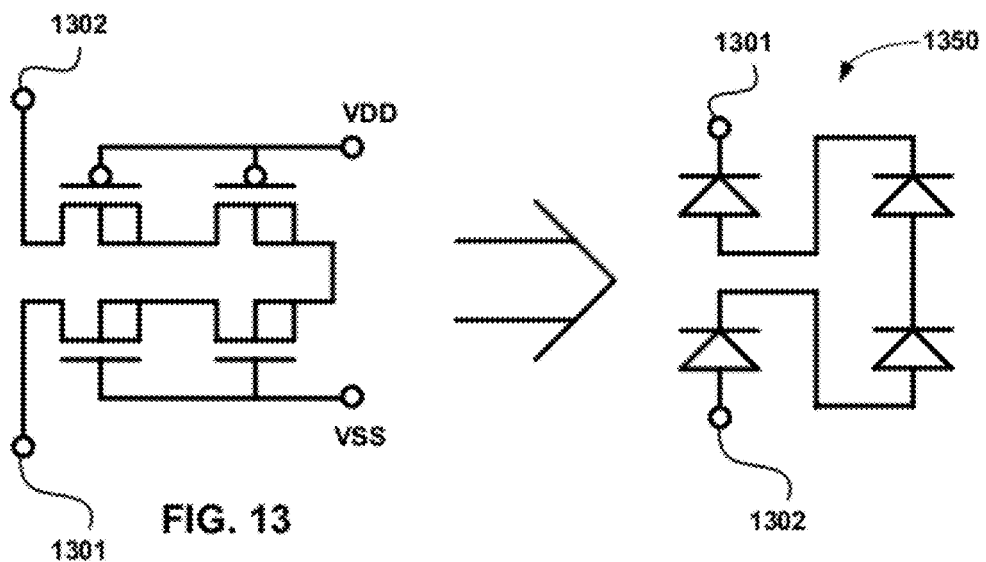
FIG. 13 is a circuit diagram illustrating an example four diode antenna circuit using the MOSFETs within an ASIC sea-of-gates gate array basecell which have separate body connections.

FIG. 13 is a circuit diagram illustrating an example of creating the four diode antenna circuit from the MOSFETs found within a sea-of-gates gate array basecell used in some gate array ASICs. Connecting the basecell MOSFETs as shown in FIG. 13 may be represented by the equivalent diode circuit diagram 1350 and may result in the four MOSFETs being positioned in such a way that a straight line can only pass through or touch at most three of the four MOSFET regions.

Figure 14:
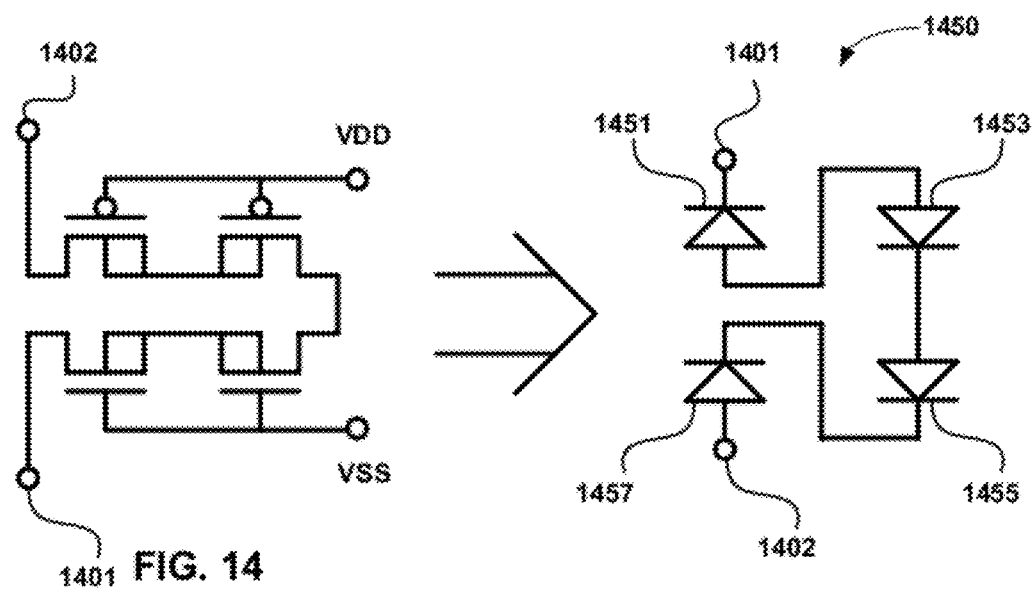
FIG. 14 is a circuit diagram illustrating an example four diode antenna circuit using the MOSFETs within an ASIC sea-of-gates gate array basecell which have shared body connections.

FIG. 14 is a circuit diagram illustrating an example of creating the four diode antenna circuit from the MOSFETs with shared body connections found within a sea-of-gates gate array basecell used in other gate array ASICs. The MOSFET circuit diagram of FIG. 14 may be represented by the equivalent diode circuit diagram 1450 and may result in the four MOSFETs being positioned in such a way that a straight line can only pass through or touch at most three of the four MOSFET regions. In this example, if an energetic particle passes through diodes (i.e., MOSFETs) 1451 and 1457, neither diodes (i.e., MOSFETs) 1453 nor 1455 are reverse biased. However, because an energetic particle can pass through up to any three diodes (i.e., MOSFETs), one of these diodes (i.e., MOSFETs) does not produce a transient current pulse, but instead is forward biased. A diode forward bias voltage drop may be approximately 0.7V. Additionally, there are also voltage drops in the other three diodes due to parasitic resistance. As a result this is a total voltage drop may be approximately 0.9V. This limits the voltage transition to may be approximately VDD—0.9V. Depending on the value of VDD, the resulting amount of voltage transition may be insufficient to go past the switching voltage of the downstream circuitry and thus will not propagate, and therefore, the circuit remains SET-hardened for small VDD values but may not be SET-hardened for large VDD values.

In one example, parasitic p-n junction structures may be present in the circuit. As a result, the parasitic p-n junction structures must be included with the intended non-parasitic diodes to determine if for all possible particle paths at least one intended diode remains reverse biased. For example, if a single parasitic p-n junction exists between the signal node and the voltage supply then an energetic particle path through the parasitic p-n junction will circumvent the at least three intended diodes and produce a transient current pulse between the signal node and the supply voltage.

Examples of this disclosure may be utilized on signal nodes driven by circuitry that may not be SET-hardened, but may have some amount of SET hardening designed in, or SET may be a concern. Placing an SET-hardened antenna protection circuit may be beneficial in eliminating the possibility of increasing SET sensitivity. In other examples, SET may not be a concern, but the circuitry may be exposed to energetic particles, and therefore, by using an SET-hardened antenna protection circuit, whatever degree of SET tolerance resides in the circuit may not be compromised by the addition of antenna protection circuits. Therefore, antenna protection circuits may be placed on any node with impunity with regard to SET.

The antenna protection circuit of this disclosure may be included in a CAD tool kit. The CAD software may treat the antenna protection circuit as a "black box." During a circuit design flow, the antenna protection circuit may be inserted on metal lines automatically by the CAD software as needed. For example, the antenna protection circuit may be automatically inserted on a metal line that exceeds a predefined ratio of metal area to polysilicon gate area. Other rules may be used to identify where to insert the antenna protection circuit in a circuit design.

It should be understood that the illustrated examples are only exemplary and should not be taken as limiting the scope of the present invention. While aspects of the present invention are illustrated with circuits comprising three or four diode devices (FIGS. 3, 4, 5, 7, 9 and 11) or diode constructed MOSFET (i.e., gated diode) devices (FIGS. 6, 8, 10 and 12) or standard constructed MOSFET devices (FIGS. 13 and 14), more devices may be utilized in constructing the circuit and other types of devices (e.g., BJTs, JFETs or SCRs) may be also utilized.

Various examples have been described in the disclosure. These and other examples are within the scope of the following claims.

The invention claimed is:

1. A protection circuit comprising:
at least three p-n junction structures connected in series;
wherein a first of the at least three p-n junction structures is connected to a first voltage line;
wherein a last of the at least three p-n junction structures is connected to a second voltage line, wherein the second voltage line is one of a voltage supply line and a ground line; and
wherein the at least three p-n junction structures are arranged such that a straight line cannot pass through all of the at least three p-n junction structures, and
wherein the at least three p-n junction structures are arranged such that normal circuit operation is not impeded if all but one of the at least three p-n junction structures produce a transient current pulse from an energetic particle.

2. The protection circuit of claim 1, wherein the at least three p-n junction structures consist of three p-n junction structures.

3. The protection circuit of claim 2, wherein the three p-n junction structures are arranged such that the straight line can pass through at most two of the three p-n junction structures.

4. The protection circuit of claim 1, wherein the at least three p-n junction structures consist of four p-n junction structures.

5. The protection circuit of claim 4, wherein the four p-n junction structures are arranged such that the straight line can pass through at most three of the four p-n junction structures.

6. The protection circuit of claim 1, wherein each two p-n junction structures of the at least three p-n junction structure are connected by a terminal, and wherein each terminal connecting two of the at least three p-n junction structures connected between the first and last of the at least three p-n junction structures includes an anode and a cathode, wherein the terminal connecting to only the first of the at least three p-n junction structures connects to the cathode of said p-n junction structure, wherein the terminal connecting to only the last of the at least three p-n junction structures connects to the anode of said p-n junction structure, wherein the cathode of the first of the at least three p-n junction structures connects to the more positive of the first voltage line and the second voltage line and the anode of the last of the at least three p-n junction structures connects to the more negative of the first voltage line and the second voltage line.

7. The protection circuit of claim 1, wherein the first voltage line is a metal line to be protected against charge accumulation.

8. The protection circuit of claim 1, wherein a single event transient tolerance of the first voltage line is not degraded by the placement of the protection circuit.

9. The protection circuit of claim 1, wherein the at least three p-n junction structures are not associated with any parasitic p-n junction structures.

10. The protection circuit of claim 1, wherein the p-n junction structures comprise at least one of: diode, MOSFET, BJT, and other p-n junction-containing devices.

11. A method for protecting a metal line from charge accumulation during fabrication without degrading a single event transient tolerance of a circuit connected to the metal line, the method comprising:
connecting at least three p-n junction structures in series;
connecting the first of the at least three p-n junction structures to a first voltage line; and
connecting the last of the at least three p-n junction structures to a second voltage line, wherein the second voltage line is one of a voltage supply line and a ground line; and
arranging the at least three p-n junction structures such that a straight line cannot pass through all of the at least three p-n junction structures; and
arranging the at least three p-n junction structures such that normal circuit operation is not impeded if all but one of the at least three p-n junction structures produce a transient current pulse from an energetic particle.

12. The method of claim 11, wherein the at least three p-n junction structures consist of three p-n junction structures.

13. The method of claim 12, wherein arranging comprises arranging the three p-n junction structures such that the straight line can pass through at most two of the three p-n junction structures.

14. The method of claim 11, wherein the at least three p-n junction structures consist of four p-n junction structures.

15. The method of claim 14, wherein arranging comprises arranging the four p-n junction structures such that the straight line can pass through at most three of the four p-n junction structures.

16. The method of claim 11, wherein connecting the at least three p-n junction structures in series comprises connecting the at least three p-n junction structures such that each two p-n junction structures of the at least three p-n junction structure are connected by a terminal, and wherein each terminal connecting two of the at least three p-n junction structures connected between the first and last of the at least three p-n junction structures includes an anode and a cathode, wherein the terminal connecting to only the first of the at least three p-n junction structures connects to the cathode of said p-n junction structure, wherein the terminal connecting to only the last of the at least three p-n junction structures connects to the anode of said p-n junction structure, wherein the cathode of the first of the at least three p-n junction structures connects to the more positive of the first voltage line and the second voltage line and the anode of the last of the at least three p-n junction structures connects to the more negative of the first voltage line and the second voltage line.

17. The method of claim 11, wherein the first voltage line is a metal line to be protected against charge accumulation.

18. The method of claim 11, wherein a single event transient tolerance of the first voltage line is not degraded by the placement of an antenna protection circuit.

19. The method of claim 11, wherein the at least three p-n junction structures are not associated with any parasitic p-n junction structures.

20. The method of claim 11, wherein the p-n junction structures comprise at least one of: diode, MOSFET, BJT, and other p-n junction-containing devices.

* * * * *